(12) United States Patent
Huang et al.

(10) Patent No.: US 11,846,659 B2
(45) Date of Patent: Dec. 19, 2023

(54) POWER CAPABILITY DETERMINATION DEVICE, ELECTRONIC DEVICE, AND POWER CAPABILITY DETERMINATION METHOD

(71) Applicant: Realtek Semiconductor Corp., HsinChu (TW)

(72) Inventors: Yueh-Hsing Huang, HsinChu (TW); Sen-Huang Tang, HsinChu (TW)

(73) Assignee: Realtek Semiconductor Corp., HsinChu (TW)

( * ) Notice: Subject to any disclaimer, the term of this patent is extended or adjusted under 35 U.S.C. 154(b) by 0 days.

(21) Appl. No.: 17/743,472

(22) Filed: May 13, 2022

(65) Prior Publication Data
US 2023/0204635 A1   Jun. 29, 2023

(30) Foreign Application Priority Data
Dec. 29, 2021   (TW) .................. 110149339

(51) Int. Cl.
*G01R 19/165*   (2006.01)
*G06F 1/28*   (2006.01)

(52) U.S. Cl.
CPC . *G01R 19/16538* (2013.01); *G01R 19/16552* (2013.01); *G06F 1/28* (2013.01); *G06F 2213/0042* (2013.01)

(58) Field of Classification Search
CPC ........ G01R 19/16538; G01R 19/16547; G01R 19/16552; G01R 31/40; G06F 1/266; G06F 1/28; G06F 1/26; G06F 2213/0042; G06F 2213/3812
See application file for complete search history.

(56) References Cited

U.S. PATENT DOCUMENTS

2020/0256894 A1    8/2020  Zhang
2020/0341036 A1*  10/2020  Liu .................. G01R 19/16538

FOREIGN PATENT DOCUMENTS

CN      105322397 A    2/2016
TW        I749855     12/2021

* cited by examiner

*Primary Examiner* — Ryan Johnson
(74) *Attorney, Agent, or Firm* — Winston Hsu (57) ABSTRACT

A power capability determination device is arranged to determine a power capability of a power source, and includes a connector, a load circuit, a switch circuit, a voltage monitor circuit, and a processing circuit. The connector is arranged to receive the power source to output an input voltage at a power output terminal. The switch circuit is electrically connected between the load circuit and the power output terminal. The voltage monitor circuit is electrically connected to the power output terminal, and is arranged to monitor the input voltage to generate a monitored voltage value. The processing circuit is electrically connected to the voltage monitor circuit and the switch circuit, and is arranged to control the switch circuit, and in a state of controlling the switch circuit, receive the monitored voltage value and determine the power capability of the power source according to the monitored voltage value.

19 Claims, 6 Drawing Sheets

POWER CAPABILITY DETERMINATION DEVICE, ELECTRONIC DEVICE, AND POWER CAPABILITY DETERMINATION METHOD

BACKGROUND OF THE INVENTION

1. Field of the Invention

The present invention is related to a power capability determination device, and more particularly, to a power capability determination device that may output a power capability index according to a power capability and associated method.

2. Description of the Prior Art

Nowadays, the power capability that may be provided by universal serial bus (USB) interface may be 5 volts (V)/500 milliamperes (mA) which belongs to USB 2.0 and 5V/900 mA which belongs to USB 3.0 or higher, and commercially available USB power adapters may supply power with a power capability exceeding 5V/500 mA (e.g. 5V/1 A or 5V/2.4 A). When a user wants to use the power provided by the USB interface or the USB power adapter, the user, however, may not know the power capability of the power provided by the used USB interface or the USB power adapter. As a result, it may cause the user to plug the power cord of an electronic product that requires a higher power capability into a USB power source that may only provide a lower power capability, thus causing the electronic product to be not able to start due to insufficient power. In addition, similar problems may occur with a high definition multimedia interface (HDMI). As a result, a novel method and associated architecture are needed for realizing fast power capability determination without introducing any side effect or in a way that is less likely to introduce a side effect, to address the above-mentioned problems.

SUMMARY OF THE INVENTION

It is therefore an objective of the present invention to provide a power capability determination device and associated method, wherein the power capability determination device may determine a power capability of a power source that is connected to the power capability determination device, so that an electronic device with the power capability determination device may set different processing methods according to the power capability of the current power source, to address the above-mentioned problems.

According to an embodiment of the present invention, a power capability determination device that is arranged to determine a power capability of a power source is provided. The power capability determination device may include a connector, a load circuit, a switch circuit, a voltage monitor circuit, and a processing circuit. The connector may be arranged to receive the power source to output an input voltage at a power output terminal. The load circuit may include at least one load. The switch circuit may be electrically connected between the load circuit and the power output terminal, and may include at least one switch. The voltage monitor circuit may be electrically connected to the power output terminal, and may be arranged to monitor the input voltage to generate a monitored voltage value. The processing circuit may be electrically connected to the voltage monitor circuit and the switch circuit, and may be arranged to control the switch circuit, and in a state of controlling the switch circuit, receive the monitored voltage value and determine the power capability of the power source according to the monitored voltage value.

According to an embodiment of the present invention, an electronic device that includes a power capability determination device is provided. The electronic device may be further arranged to process an input signal, and set a process method of the input signal according to the power capability of the power source.

According to an embodiment of the present invention, a power capability determination method is provided. The power capability determination method may include: receiving the power source to output an input voltage at a power output terminal; monitoring the input voltage to generate a monitored voltage value; electrically connecting a switch circuit between the power output terminal and a load circuit, wherein the load circuit comprises at least one load, and the switch circuit comprises at least one switch; controlling the switch circuit; and in a state of controlling the switch circuit, receiving the monitored voltage value and determining the power capability of the power source according to the monitored voltage value.

One of the benefits of the present invention is that, a power capability of a power source may be determined fast and a power capability index may be generated by different loads, so that an electronic device with the power capability determination device of the present invention may determine whether to start according to the power capability index, or further perform different operations according to different power capability indexes. Compared with the related art, the power capability determination device of the present invention may realize the power capability determination with no or less side effect.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
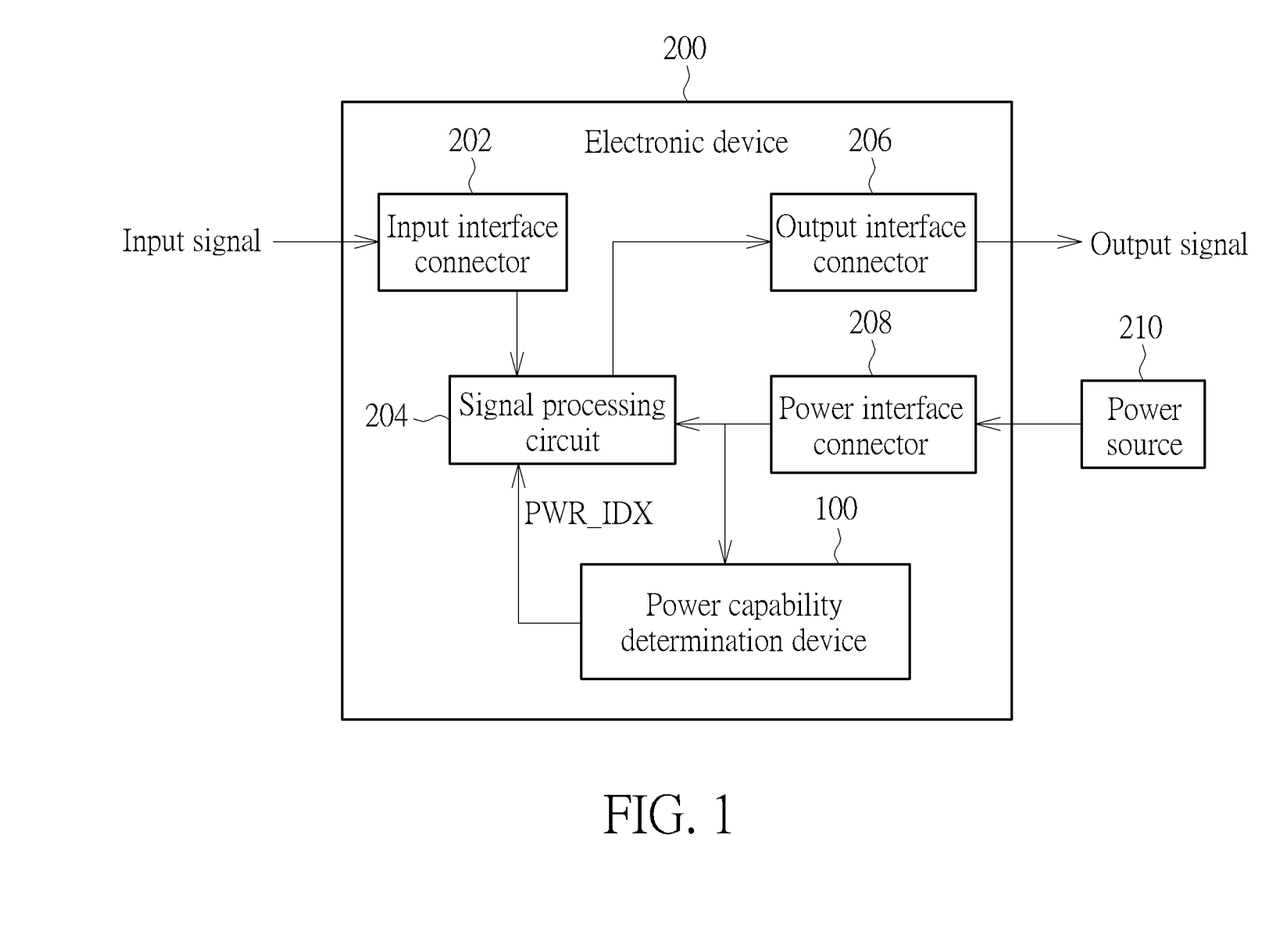
FIG. 1 is a diagram illustrating a power capability determination device that may be applied to an electronic device for performing power capability determination according to an embodiment of the present invention.

Please refer to FIG. 1. FIG. 1 is a diagram illustrating a power capability determination device 100 that may be applied to an electronic device 200 for performing power capability determination according to an embodiment of the present invention. As shown in FIG. 1, the electronic device 200 may include an input interface connector 202, a signal processing circuit 204, an output interface connector 206, a power source interface connector 208, and the power capability determination device 100 proposed by the present invention. The input interface connector 202 may be arranged to receive an input signal, and transmit the input signal to the signal processing circuit 204. The signal processing circuit 204 may be arranged to process the input signal to generate an output signal. The output interface connector 206 may be arranged to output the output signal. The power source interface connector 208 may be arranged to receive a power source 210, and transmit the power source 210 to the signal processing circuit 204 and the power capability determination device 100. Any of the input interface connector 202, the output interface connector 206, and the power source interface connector 208 may be a universal serial bus (USB) connector or a high definition multimedia interface (HDMI) connector.

In some embodiments, the input interface connector 202 and the power source connector 208 may be implemented as a same connector. For example, when the input signal is from a playback device and the input interface is HDMI, the input interface connector 202 and the power source connector 208 may be combined into only one HDMI connector that receives an input signal and a power source from the playback device at the same time. In some embodiments, the output interface connector 206 and the power source connector 208 may be implemented as a same connector. For example, when the output signal is output to a display and the output interface is USB, the output interface connector 206 and the power source connector 208 may be combined into only one USB connector that outputs an output signal to the display and receives a power source from the display at the same time.

Figure 2:
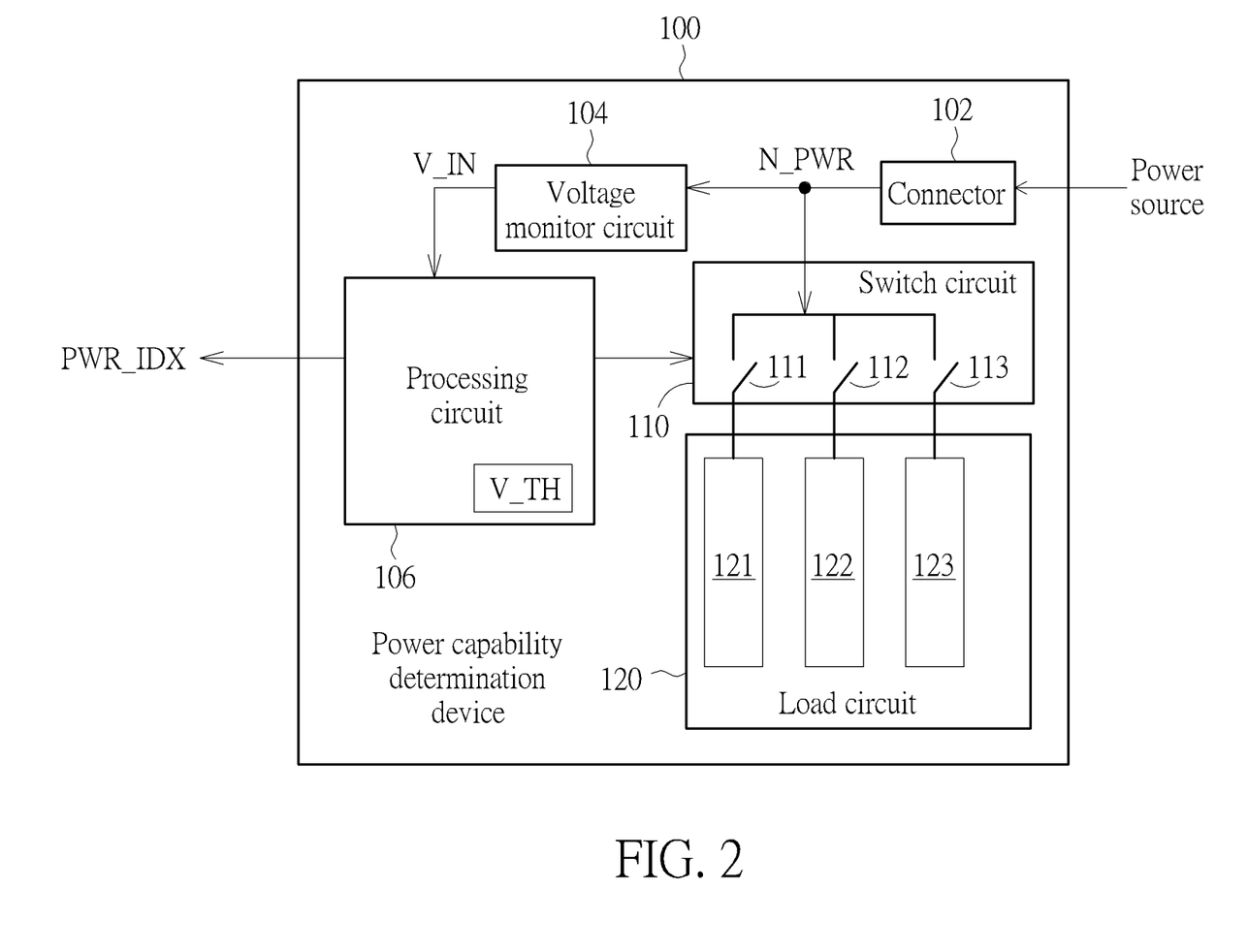
FIG. 2 is a block diagram of a power capability determination device according to a first embodiment of the present invention.

The power capability determination device 100 may be arranged to output a power capability index PWR_IDX to the signal processing circuit 204. However, the power capability index PWR_IDX generated according to different power source interfaces may be different, and the present invention provides two embodiments. Please refer to FIG. 2. FIG. 2 is a block diagram of a power capability determination device 100 according to a first embodiment of the present invention. As shown in FIG. 2, the power capability determination device 100 may include a connector 102, a voltage monitor circuit 104, a switch circuit 110, a load circuit 120, and a processing circuit 106. The connector 102 may be arranged to receive a power source (e.g. the power source 210 connected to the power source interface connector 208 shown in FIG. 1), for outputting an input voltage at a power output terminal N_PWR. In this embodiment, the connector 102 is a USB power source connector, wherein if the power source interface connector 208 of the electronic device 200 is also a USB interface, the connector 102 and the power source interface connector 208 may be combined into a single USB power source connector.

The load circuit 120 may include a plurality of different loads (e.g. a first load 121, a second load 122, and a third load 123). The switch circuit 110 may be electrically connected between the load circuit 120 and the power output terminal N_PWR of the connector 102, wherein the switch circuit 110 may include a plurality of switches that are electrically connected to the first load 121, the second load 122, and the third load 123, respectively. For example, the switch circuit 110 may include a first switch 111, a second switch 112, and a third switch 113, and the first switch 111, the second switch 112, and the third switch 113 are electrically connected to the first load 121, the second load 122, and the third load 123, respectively. The voltage monitor circuit 104 may be electrically connected to the power output terminal N_PWR of the connector 102, and may be arranged to monitor the input voltage to generate a monitored voltage value V_IN. The processing circuit 106 may be electrically connected to the voltage monitor circuit 104 and the switch circuit 110, and may be arranged to control the first switch 111, the second switch 112, and the third switch 113, and in a state of controlling the switch circuit 110, receive the monitored voltage value V_IN and determine the power capability of the power source (e.g. the power source 210 shown in FIG. 1) according to the monitored voltage value V_IN.

For example, when the connector 102 receives a USB power source and output an input voltage, the voltage monitor circuit 104 may monitor and detect the input voltage to generate the monitored voltage value V_IN. The processing circuit 106 may determine whether the monitored voltage value V_IN is larger than a threshold value V_TH. In the beginning, all of the first switch 111, the second switch 112, and the third switch 113 are switched off. Since in the relevant specifications of USB, the minimum voltage of the USB power source that can provide the current is 4.75 volts (V), the threshold V_TH may be set as 4.75 V. At this moment, if the monitored voltage value V_IN (i.e. the input voltage) is not larger than the threshold value V_TH (e.g. 4.75 V), the processing circuit 106 may generate a damaged power capability index Index_0 (i.e. PWR_IDX=Index_0) to indicate the power capability of the power source (e.g. the power source failure).

If the monitored voltage value V_IN (i.e. the input voltage) is larger than the threshold value V_TH (e.g. 4.75 V), the processing circuit 106 may switch on the first switch 111 to make the power output terminal N_PWR be electrically connected to the first load 121 (both of the second switch 112 and the third switch 113 are switched off), and determine the monitored voltage value V_IN at this moment. If the monitored voltage value V_IN is not larger than the threshold value V_TH (e.g. 4.75 V) at this moment, the processing circuit 106 may generate a first power capability index Index_1 (e.g. PWR_IDX=Index_1). If the monitored voltage value V_IN is still larger than the threshold value V_TH (e.g. 4.75 V) at this moment, the switch circuit 106 may switch off the first switch 111 and switch on the second switch 112, and the third switch 113 is still switched off. In this embodiment, the first load 121 is set as a load that detects whether the power source is capable of providing 0.5 amperes (A) current. That is, when the monitored voltage value V_IN is larger than the threshold value V_TH (e.g. 4.75 V) under the condition that the power output terminal N_PWR is electrically connected to the first load 121, it represents that the power capability of the power source may output the 0.5 A current, but the present invention is not limited thereto. The load value in the load circuit may be changed depending on demands.

The processing circuit 106 may switch on the second switch 112 to make the power output terminal N_PWR be electrically connected to the second load 122 (both of the first switch 111 and the third switch 113 are switched off), and determine the monitored voltage value V_IN at this moment. If the monitored voltage value V_IN is not larger than the threshold value V_TH (e.g. 4.75 V) at this moment, the processing circuit 106 may generate a second power capability index Index_2 (i.e. PWR_IDX=Index_2); if the monitored voltage value V_IN is still larger than the threshold value at this moment, the processing circuit 106 may switch off the second switch 112 and switch on the third switch 113, and the first switch 111 is still switched off.

The processing circuit 106 may switch on the third switch 113 to make the power output terminal N_PWR be electrically connected to the third load 123 (both of the first switch 111 and the second switch 112 are switched off), and determine the monitored voltage value V_IN at this moment. If the monitored voltage value V_IN is not larger than the threshold value V_TH (e.g. 4.75 V) at this moment, the processing circuit 106 may generate a third power capability index Index_3 (i.e. PWR_IDX=Index_3); if the monitored voltage value V_IN is still larger than the threshold value V_TH at this moment, the processing circuit 106 may generate a fourth power capability index Index_4 (i.e. PWR_IDX=Index_4).

In the first embodiment of the present invention, the connector 102 is a USB power source connector. As a result, the first load 121 may be set as a load that is arranged to detect whether the power source is capable of providing 0.5 A current, the second load 122 may be set as a load that is arranged to detect whether the power source is capable of providing 1 A current, and the third load 123 may be set as a load that is arranged to detect whether the power source is capable of providing 1.5 A current, but the present invention is not limited thereto. The load value in the load circuit may be changed depending on demands. In other words, when the power capability determination device 100 generates the damaged power capability index Index_0, it represents that the power source may be damaged; when the power capability determination device 100 generates the first power capability index Index_1, it represents that the current that may be provided by the power source is less than 0.5 A; when the power capability determination device 100 generates the second power capability index Index_2, it represents that the current that may be provided by the power source is less than 1 A; when the power capability determination device 100 generates the third power capability index Index_3, it represents that the current that may be provided by the power source is larger than 1 A, but is less than 1.5 A; and when the power capability determination device 100 generates the fourth power capability index Index_4, it represents that the current that may be provided by the power source is larger than 1.5 A.

According to the above-mentioned configuration, the power capability determination device 100 in the first embodiment of the present invention may be arranged to determine a power capability of a USB power source, and notify the power capability of the power source 210 utilized by the electronic device 200 by outputting different power capability index PWR_IDX. Then, the electronic device 200 may start different functions according to the power capability index PWR_IDX. For example, the different functions may have different power consumption, respectively. It is assumed that the electronic device 200 shown in FIG. 1 is a signal processing circuit that is arranged to process a video/audio signal. When the power capability index PWR_IDX received by the signal processing circuit 204 of the electronic device 200 is the damaged power capability index Index_0 or the first power capability index Index_1, the electronic device 200 will not perform image processing; when the power capability index PWR_IDX received by the signal processing circuit 204 is the second power capability index Index_2, the electronic device 200 will only perform frame size scaling upon the input signal; when the power capability index PWR_IDX received by the signal processing circuit 204 is the third power capability index Index_3, the electronic device 200 will perform the frame size scaling and the default image processing (e.g. image sharpness adjustment and super resolution) upon the input signal; and when the power capability index PWR_IDX received by the signal processing circuit 204 is the fourth power capability index Index_4, the electronic device 200 will perform the frame size scaling and the scene detection upon the input signal, invoke corresponding image processing settings, and perform the image processing. In general, the higher the current that may be provided by the power source as indicated by the power capability index PWR_IDX, the more image processing or the more complex image processing the electronic device 200 may perform upon the input signal. It is noted that, the above-mentioned operation examples corresponding to different values of the power capability index PWR_IDX, respectively, are for illustrative purposes only, and the present invention is not limited thereto.

Figure 3:
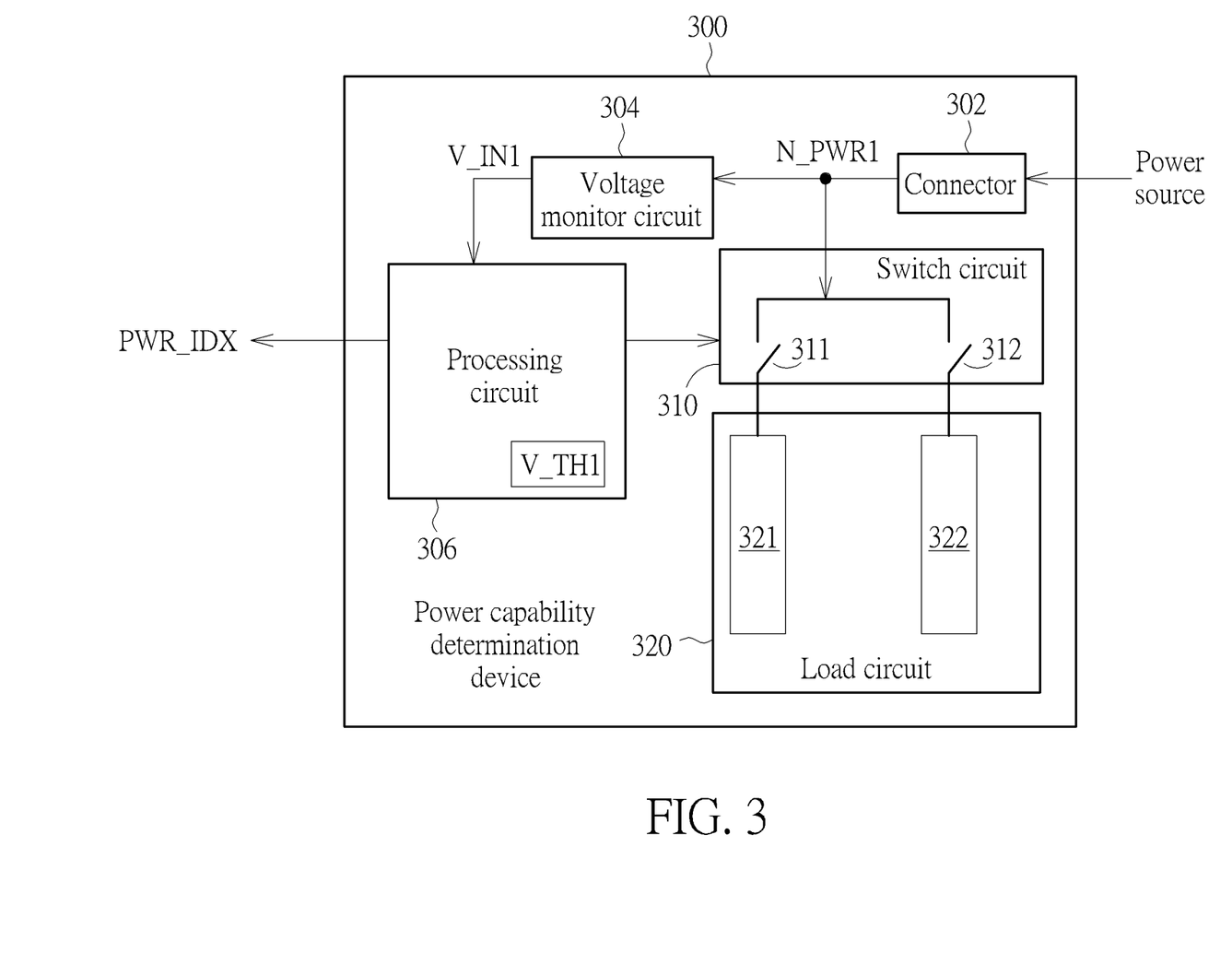
FIG. 3 is a block diagram of a power capability determination device according to a second embodiment of the present invention.

Please refer to FIG. 3. FIG. 3 is a block diagram of a power capability determination device 300 according to a second embodiment of the present invention, wherein the power capability determination device 300 may be arranged to determine a power capability of an HDMI interface power source. The power capability determination device 100 shown in FIG. 1 may be implemented by the power capability determination device 300 shown in FIG. 3. As shown in FIG. 3, the power capability determination device 300 may include a connector 302, a voltage monitor circuit 304, a switch circuit 310, a load circuit 320, and a processing circuit 306, wherein the load circuit may include a plurality of different loads (e.g. a first load 321 and a second load 322), and the switch circuit 310 may include a plurality of switches that are electrically connected to the different loads in the load circuit 320. For example, the switch circuit 310 may include a first switch 311 and a second switch 312, wherein the first switch 311 and the second switch 312 are electrically connected to the first load 321 and the second load 322, respectively.

The difference between the power capability determination device 300 and the power capability determination device 100 is that: the connector 302 is an HDMI power source connector and the switch circuit 310 and the load circuit 320 include two switches and two loads, respectively. Similarly, if the power interface connector 208 of the electronic device 200 is also an HDMI interface, the connector 302 and the power interface connector 208 may be combined into a single HDMI power source connector. Similarly, when the connector 302 receives an HDMI power source and output an input voltage, the voltage monitor circuit 304 may monitor and detect the input voltage and output a monitored voltage value V_IN1. The processing circuit 306 may determine whether the monitored voltage value V_IN1 is larger than a threshold value V_TH1.

In the beginning, both of the first switch 321 and the second switch 322 are switched off. If the monitored voltage value V_IN1 (i.e. the input voltage) is not larger than the threshold value V_TH1 at this moment, the processing circuit 306 may generate a damaged power capability index Index_0 (i.e. PWR_IDX=Index_0) to indicate the power capability of the HDMI power source (i.e. the power source failure). If the monitored voltage value V_IN1 (i.e. the input voltage) is larger than the threshold value V_TH1, the processing circuit 306 may switch on the first switch 311 for electrically connecting a power output terminal N_PWR1 of the connector 302 to the first load 321 (the second switch 322 is still switched off at this moment), and determine the monitored voltage value V_IN1 at this moment. If the monitored voltage value V_IN1 is not larger than the threshold value V_TH1 at this moment, the processing circuit 306 may generate a first power capability index Index_1 (i.e. PWR_IDX=Index_1); if the monitored voltage value V_IN1 is larger than the threshold value V_TH1 at this moment, the processing circuit 306 may switch off the first switch 311, switch on the second switch 312 for electrically connecting the power output terminal N_PWR1 to the second load 322, and determine the monitored voltage value V_IN1 at this moment. If the monitored voltage value V_IN1 is not larger than the threshold value V_TH1 at this moment, the processing circuit 306 may generate a second power capability index Index_2 (i.e. PWR_IDX=Index_2); if the monitored voltage value V_IN1 is larger than the threshold value V_TH1 at this moment, the processing circuit 306 may generate a third power capability index Index_3 (i.e. PWR_IDX=Index_3). It is noted that, the load values of the first load 321 and the second load 322 may be set depending on demands. For example, the first load 321 may be set as a load that is arranged to detect whether the power source is capable of providing 0.05 A current, and the second load 322 may be set as a load that is arranged to detect whether the power source is capable of providing 0.3 A current, but the present invention is not limited thereto.

Figure 4:
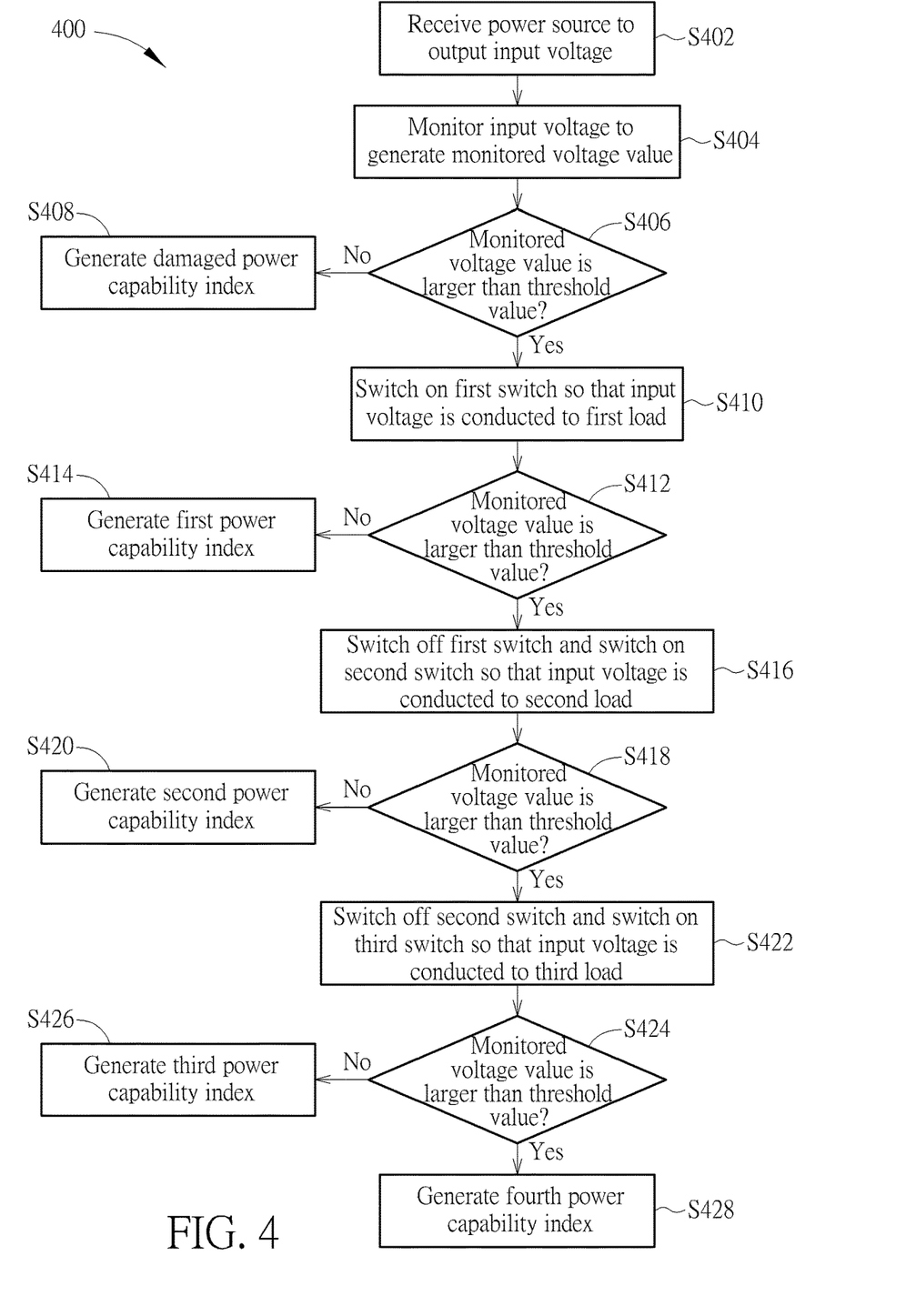
FIG. 4 is a flow chart of a power capability determination method according to an embodiment of the present invention.

Please refer to FIG. 4. FIG. 4 is a flow chart 400 of a power capability determination method according to an embodiment of the present invention. Provided that the result is substantially the same, the steps are not required to be executed in the exact order shown in FIG. 4. The method of the present invention may include the following steps:

Step S402: a power source is received to output an input voltage;

Step S404: the input voltage is monitored to generate a monitored voltage value;

Step S406: it is determined that whether the monitored voltage value is larger than a threshold value; if no, the Step S408 is entered; if yes, the Step S410 is entered;

Step S408: a damaged power capability index is generated;

Step S410: a first switch is switched on so that the input voltage is conducted to a first load;

Step S412: it is determined that whether the monitored voltage value is larger than the threshold value; if no, Step S414 is entered; if yes, Step S416 is entered;

Step S414: a first power capability index is generated;

Step S416: the first switch is switched off and a second switch is switched on so that the input voltage is conducted to a second load;

Step S418: it is determined that whether the monitored voltage value is larger than the threshold value; if no, Step S420 is entered; if yes, Step S422 is entered;

Step S420: a second power capability index is generated;

Step S422: the second switch is switched off and a third switch is switched on so that the input voltage is conducted to a third load;

Step S424: it is determined that whether the monitored voltage value is larger than the threshold value; if no, Step S426 is entered; if yes, Step S428 is entered;

Step S426: a third power capability index is generated; and

Step S428: a fourth power capability index is generated.

It is noted that, the flow chart 400 of the power capability determination method takes the power capability determination device with 3 loads in the first embodiment of the present invention as an example, but the present invention is not limited thereto. Specifically, the number of loads in the load circuit may be changed depending on demands. For example, under the condition that the load circuit only has a first load and a second load, Step S418 should be modified as: determining whether the monitored voltage value is larger than the threshold value; if no, Step S420 is entered; if yes, Step S426 is entered, and the flow ends after the second/third power capability index is generated.

Figure 5:
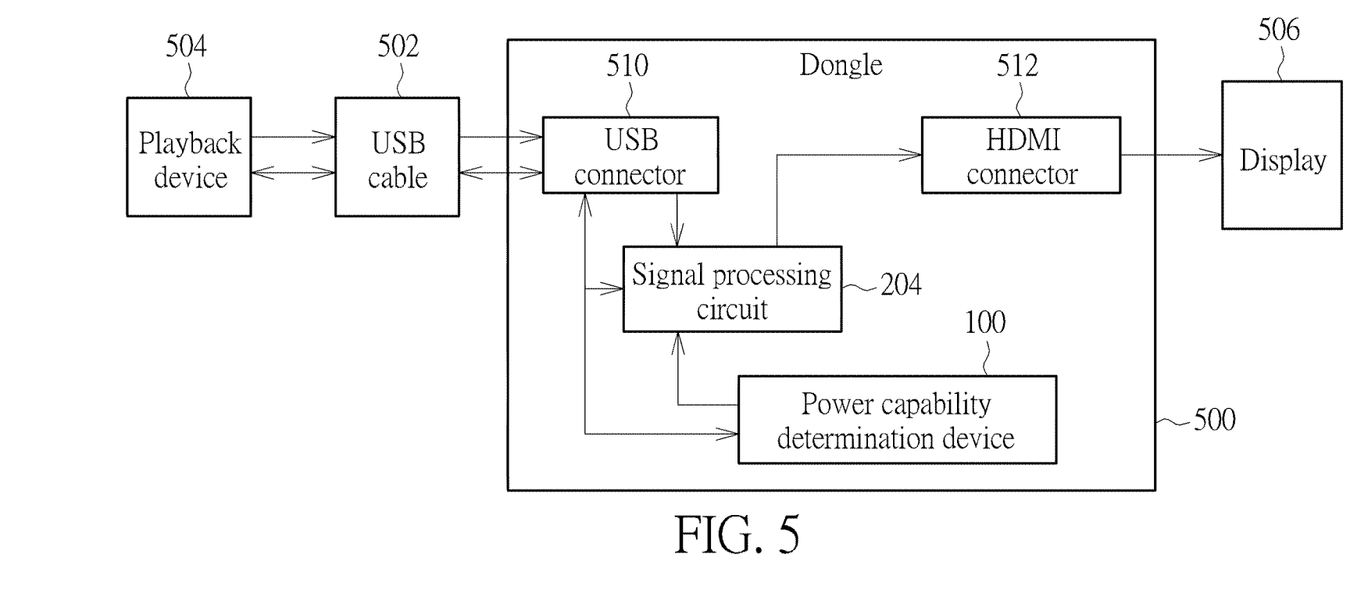
FIG. 5 is a block diagram of a power capability determination device applied to a playback system with a dongle according to an embodiment of the present invention.
Figure 6:
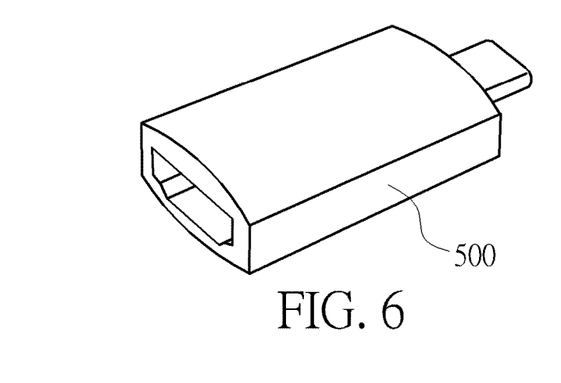
FIG. 6 is a diagram illustrating a product of the dongle shown in FIG. 5.

The power capability determination device 100/300 of the present invention may be applied to an audio/video device. For example, a video signal is transmitted from a playback device to a dongle or an adaptor cable of a display. Please refer to FIG. 5 in conjunction with FIG. 6. FIG. 5 is a block diagram of the power capability determination device 100 applied to a playback system with a dongle 500 according to an embodiment of the present invention. FIG. 6 is a diagram illustrating a product of the dongle 500 shown in FIG. 5. As shown in FIG. 5, the power capability determination device 100 may be implemented in the dongle 500. One terminal of the dongle 500 (e.g. an HDMI connector 512) may be coupled to a display 506 (e.g. may be plugged into a port of the display 506 by utilizing an HDMI plug or may be connected to the port of the display 506 by utilizing the HDMI connector), and another terminal of the dongle 500 (e.g. a USB connector 510) may be coupled to a USB cable 502, and may be coupled to a playback device 504 through the USB cable 502. In this embodiment, the input signal is transmitted to the signal processing circuit 204 through the USB connector 510, and the power source is also transmitted to the signal processing circuit 204 and the power capability determination device 100 through the USB connector 510. After the power capability determination device 100 receives the USB power source, the power capability determination device 100 generates and transmits a power capability index to the signal processing circuit 204 according to the USB power source, and the signal processing circuit 204 performs corresponding operation(s) according to the power capability index. As shown in FIG. 6, the dongle 500 may be implemented by this product structure. It should be noted that, FIG. 5 and FIG. 6 illustrate only one of various implementations of the present invention. As a result, a playback system with the dongle 500 is not limited to the implementation shown in FIG. 5 and FIG. 6. For example, the dongle 500 may also be designed as a device that is plugged into or coupled to a playback device. That is, one terminal of the dongle 500 is coupled to the playback device 504, and another terminal of the dongle 500 is coupled to display 506 through a cable or a transmitting line.

Figures 7, 8:
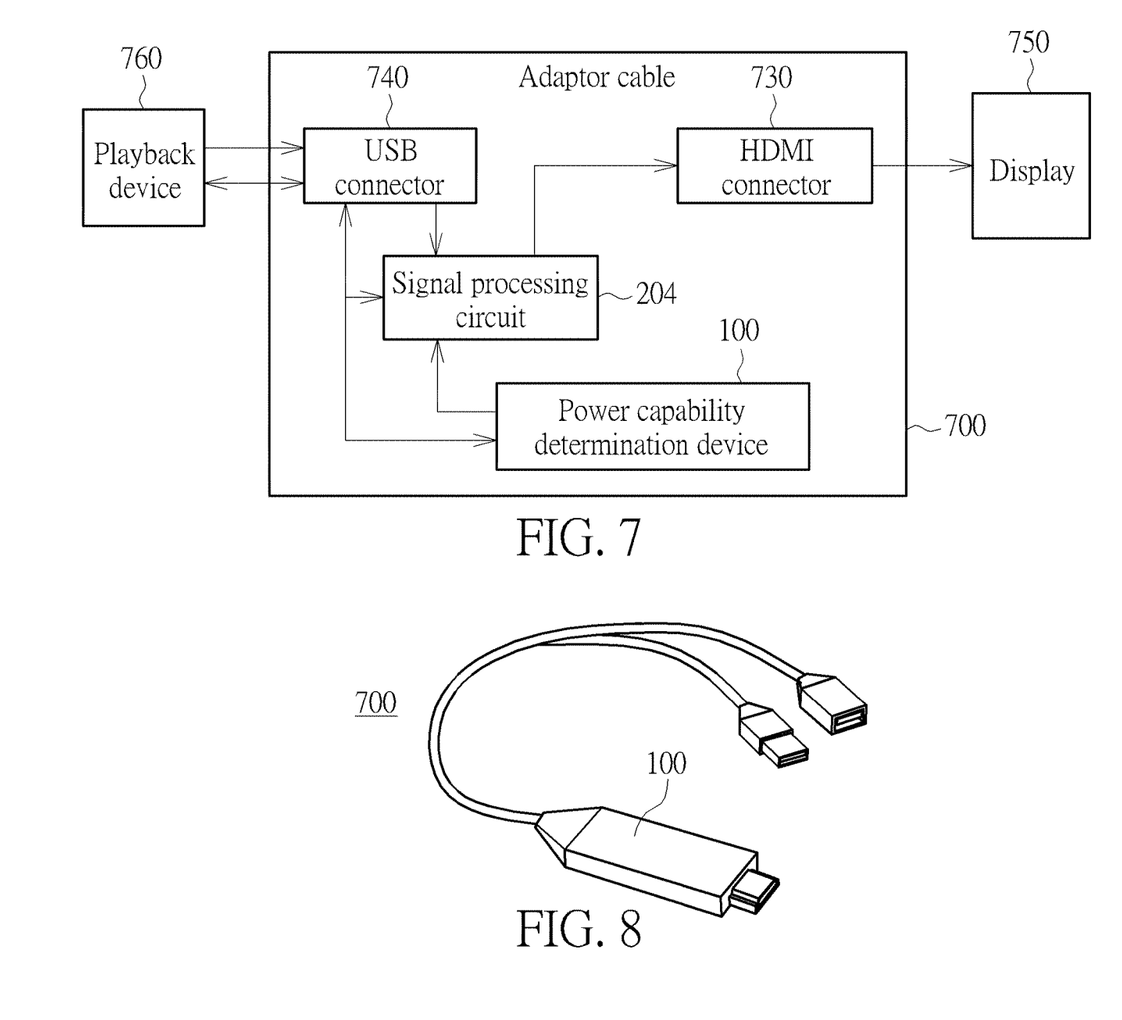
FIG. 7 is a block diagram of a power capability determination device applied to a playback system with an adaptor cable according to an embodiment of the present invention.
FIG. 8 is a diagram illustrating a product of the adaptor cable shown in FIG. 7.

For another example, please refer to FIG. 7 in conjunction with FIG. 8. FIG. 7 is a block diagram of the power capability determination device 100 applied to a playback system with an adaptor cable 700 according to an embodiment of the present invention. FIG. 8 is a diagram illustrating a product of the adaptor cable 700 shown in FIG. 7. One terminal of the adaptor cable 700 (e.g. an HDMI connector 730) may be coupled to a display 750 (e.g. may be plugged into a port of the display 750 by utilizing a plug or may be connected to the port of the display 750 by utilizing a connector), and another terminal of the adaptor cable 700 may be coupled to a playback device 760 (e.g. may be plugged into a port of the playback device 760 by utilizing an plug or may be connected to the port of the playback device 760 by utilizing a connector). In this embodiment, the signal transmitting device including the signal processing device is the signal transmitting element configured on a signal transmitting path between the playback device and the display. The input signal is transmitted to the signal processing circuit 204 by a USB connector 740, and the power source is also transmitted to the signal processing circuit 204 and the power capability determination device 100 by the USB connector 740. After the power capability determination device 100 receives the USB power source, the power capability determination device 100 generates and transmits a power capability index to the signal processing circuit 204 according to the USB power source, and the signal processing circuit 204 performs corresponding operation(s) according to the power capability index. As shown in FIG. 8, the adaptor cable 700 may be implemented by this product structure, and the power capability determination device 100 may be set in the larger-structured connector at both terminals of the adaptor cable 700. It is noted that, FIG. 7 and FIG. 8 illustrate only one of various implementations of the present invention. As a result, a playback system with the adaptor cable 700 is not limited to the implementation shown in FIG. 7 and FIG. 8.

One of the benefits of the present invention is that, a power capability of a power source may be determined fast and a power capability index may be generated by different loads, so that an electronic device with the power capability determination device of the present invention may determine whether to start according to the power capability index, or further perform different operations according to different power capability indexes. Compared with the related art, the power capability determination device of the present invention may realize the power capability determination without introducing any side effect or in a way that is less likely to introduce a side effect.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A power capability determination device for determining a power capability of a power source, comprising:
   a connector, arranged to receive the power source to output an input voltage at a power output terminal;
   a load circuit, wherein the load circuit comprises multiple loads;
   a switch circuit, electrically connected between the load circuit and the power output terminal, wherein the switch circuit comprises multiple switches;
   a voltage monitor circuit, electrically connected to the power output terminal, and arranged to monitor the input voltage to generate a monitored voltage value; and
   a processing circuit, electrically connected to the voltage monitor circuit and the switch circuit, and arranged to control the switch circuit, and in a state of controlling the switch circuit, receive the monitored voltage value and determine the power capability of the power source according to the monitored voltage value.

2. The power capability determination device of claim 1, wherein the connector is a universal serial bus (USB) connector or a high definition multimedia interface (HDMI) connector.

3. The power capability determination device of claim 1, wherein the processing circuit is further arranged to compare the monitored voltage value with a threshold value, to determine the power capability of the power source.

4. The power capability determination device of claim 3, wherein the multiple loads comprise a first load; the multiple switches comprise a first switch, the first switch is electrically connected between the first load and the power output terminal; and in response to the processing circuit switching on the first switch for electrically connecting the power output terminal to the first load, and determining that the monitored voltage value is not larger than the threshold value, the processing circuit generates a power capability index to indicate the power capability of the power source.

5. The power capability determination device of claim 4, wherein the multiple loads further comprise a second load that is different from the first load; the multiple switches further comprise a second switch, the second switch is electrically connected between the second load and the power output terminal; and in response to the processing circuit switching on the second switch for electrically connecting the power output terminal to the second load, and determining that the monitored voltage value is larger than the threshold value, the processing circuit switches off the second switch and switches on the first switch.

6. The power capability determination device of claim 4, wherein in response to the processing circuit switching off the switch circuit for disconnecting the power output terminal from the load circuit, and determining that the monitored voltage value is larger than the threshold value, the processing circuit switches on the first switch.

7. The power capability determination device of claim 3, wherein in response to the processing circuit switches off the switch circuit for disconnecting the power output terminal from the load circuit, and determining that the monitored voltage is not larger than the threshold value, the processing circuit generates a damaged power capability index to indicate the power capability of the power source.

8. The power capability determination device of claim 3, wherein the threshold value is 4.75 volts.

9. A electronic device, comprising a power capability determination device of claim 1, wherein the electronic device is further arranged to process an input signal, and set a process method of the input signal according to the power capability of the power source.

10. The electronic device of claim 9, wherein the electronic device is a dongle, the dongle is arranged to detect and process a first video signal, to generate a second video signal, and the dongle processes the first video signal according to the power capability of the power source.

11. The electronic device of claim 9, wherein the electronic device is an adaptor cable, the adaptor cable is arranged to detect and process a first video signal, to generate a second video signal, and the adaptor cable processes the first video signal according to the power capability of the power source.

12. A power capability determination method for determining a power capability of a power source, comprising:
   receiving the power source to output an input voltage at a power output terminal;
   monitoring the input voltage to generate a monitored voltage value;
   electrically connecting a switch circuit between the power output terminal and a load circuit, wherein the load circuit comprises multiple loads, and the switch circuit comprises multiple switches;
   controlling the switch circuit; and
   in a state of controlling the switch circuit, receiving the monitored voltage value and determining the power capability of the power source according to the monitored voltage value.

13. The power capability determination method of claim 12, wherein the power source is received by a universal serial bus (USB) connector, or is received by a high definition multimedia interface (HDMI) connector.

14. The power capability determination method of claim 12, wherein determining the power capability of the power source according to the monitored voltage value comprises:
comparing the monitored voltage value with a threshold value in order to determine the power capability of the power source.

15. The power capability determination method of claim 14, wherein the multiple loads comprise a first load; the multiple switches comprise a first switch that is electrically connected to the first load; and comparing the monitored voltage value with the threshold value, to determine the power capability of the power source comprises:
in response to switching on the first switch so that the input voltage is conducted to the first load, and determining that the monitored voltage value is not larger than the threshold value, generating a power capability index to indicate the power capability of the power source.

16. The power capability determination method of claim 15, wherein the multiple loads further comprise a second load that is different from the first load; the multiple switches further comprise a second switch that is electrically connected to the second load; and comparing the monitored voltage value with the threshold value, to determine the power capability of the power source further comprises:
in response to switching on the second switch so that the input voltage is conducted to the second load, and determining that the monitored voltage value is larger than the threshold value, switching off the second switch and switching on the first switch.

17. The power capability determination method of claim 15, wherein comparing the monitored voltage value with the threshold value, to determine the power capability of the power source further comprises:
in response to switching off the switch circuit so that the input voltage is not conducted to the load circuit, and determining that the monitored voltage value is larger than the threshold value, switching on the first switch.

18. The power capability determination method of claim 14, wherein comparing the monitored voltage value with the threshold value, to determine the power capability of the power source comprises:
in response to switching off the switch circuit so that the input voltage is not conducted to the load circuit, and determining that the monitored voltage value is not larger than the threshold value, generating a damaged power capability index to indicate the power capability of the power source.

19. The power capability determination method of claim 14, wherein the threshold value is 4.75 volts.

* * * * *